United States Patent
Hoffknecht et al.

(10) Patent No.: US 8,658,929 B2
(45) Date of Patent: Feb. 25, 2014

(54) SWITCH

(75) Inventors: Marc Hoffknecht, Newmarket (CA); Peter Reist, Aurora (CA); Javier Orlando Rojas, Mississauga (CA); Timothy J. Poupore, Toronto (CA); Steve Armstrong, Toronto (CA)

(73) Assignee: OSRAM SYLVANIA Inc., Danvers ( * ) Notice: Subject to any disclaimer, the term of this patent is extended or adjusted under 35 U.S.C. 154(b) by 273 days.

(21) Appl. No.: 13/161,358

(22) Filed: Jun. 15, 2011

(65) Prior Publication Data
US 2012/0318657 A1    Dec. 20, 2012

(51) Int. Cl.
*H01H 11/00*    (2006.01)

(52) U.S. Cl.
USPC ........................................................ 200/600

(58) Field of Classification Search
USPC .................................. 200/600, 5 A, 5 R, 61.55
See application file for complete search history.

(56) References Cited

U.S. PATENT DOCUMENTS

| | | | | |
|---|---|---|---|---|
| 4,237,386 | A * | 12/1980 | Instance ........................ | 200/51.1 |
| 4,407,447 | A | 10/1983 | Sayegh | |
| 5,036,168 | A * | 7/1991 | Kikuchi et al. ................ | 200/5 R |
| 5,059,871 | A | 10/1991 | Pearlman et al. | |
| 5,572,438 | A | 11/1996 | Ehlers et al. | |
| 5,682,949 | A | 11/1997 | Ratcliffe et al. | |
| 5,701,058 | A | 12/1997 | Roth | |
| 5,703,442 | A | 12/1997 | Notohamiprodjo et al. | |
| 5,812,422 | A | 9/1998 | Lyons | |
| 5,962,989 | A | 10/1999 | Baker | |
| 6,118,230 | A | 9/2000 | Fleischmann | |
| 6,181,086 | B1 | 1/2001 | Katyl et al. | |
| 6,208,905 | B1 | 3/2001 | Giddings et al. | |
| 6,359,564 | B1 | 3/2002 | Thacker | |
| 6,388,396 | B1 | 5/2002 | Katyl et al. | |
| 6,388,399 | B1 | 5/2002 | Eckel et al. | |
| 6,583,573 | B2 | 6/2003 | Bierman | |
| 6,792,319 | B1 | 9/2004 | Bilger | |
| 7,285,723 | B2 * | 10/2007 | Lindenstraus et al. .......... | 174/66 |
| 7,915,553 | B2 * | 3/2011 | Arione et al. ................. | 200/314 |
| 8,289,716 | B2 * | 10/2012 | Patel et al. .................... | 361/728 |
| 2002/0047628 | A1 | 4/2002 | Morgan et al. | |
| 2005/0043907 | A1 * | 2/2005 | Eckel et al. .................... | 702/62 |

(Continued)

FOREIGN PATENT DOCUMENTS

DE    39 10 977 A1    10/1990

OTHER PUBLICATIONS

"Dali Command MultiDim Intelligent Lighting Control System," Philips Dali Command MultiDim, Apr. 2002, pp. 1 to 11.

(Continued)

*Primary Examiner* — Briggitte R Hammond
(74) *Attorney, Agent, or Firm* — Shaun P. Montana

(57) ABSTRACT

A switch according to various embodiments of the disclosure comprises a mechanical actuator configured to control a function associated with the switch and a face coupled to the actuator. The face is configured to depress in response to a force applied to at least a portion of the face, whereby depression of the face engages the actuator to control the function associated with the switch. The face includes a plurality of segments, each segment for controlling a respective additional function associated with the switch. A respective capacitive touch sensor is coupled to each respective segment of the plurality of segments, wherein each capacitive touch sensor is configured to control the function associated with its respective segment in response to detecting human skin in contact with the segment.

19 Claims, 4 Drawing Sheets

(56) References Cited

U.S. PATENT DOCUMENTS

| | | | |
|---|---|---|---|
| 2005/0093275 A1* | 5/2005 | Xu et al. | 200/61.55 |
| 2005/0122064 A1 | 6/2005 | Chevalier et al. | |
| 2005/0173231 A1* | 8/2005 | Gonzales | 200/5 R |
| 2008/0251364 A1* | 10/2008 | Takala et al. | 200/341 |
| 2009/0301852 A1* | 12/2009 | Keist et al. | 200/341 |
| 2010/0253629 A1 | 10/2010 | Orsley | |

OTHER PUBLICATIONS

Brigitta Klag, Invitation to Pay Additional Fees including Results of Partial International Search, Sep. 28, 2012, pp. 1-5, European Patent Office, Rijswijk, The Netherlands.

USPTO; Office Action dated Mar. 2, 2006 in U.S. Appl. No. 10/425,631.

USPTO; Office Action dated Dec. 6, 2005 in U.S. Appl. No. 10/425,631.

USPTO; Final Office Action dated Nov. 7, 2006 in U.S. Appl. No. 10/425,631.

USPTO; Office Action dated Feb. 27, 2007 in U.S. Appl. No. 11/514,145.

EPO; Examination Report dated Jun. 20, 2008 in EPO Application No. 2003737777.7.

PCT; International Search Report dated Aug. 21, 2003 in PCT Application No. PCT/CA/2003/000922.

PCT; Written Opinion dated Aug. 2, 2004 in PCT Application No. PCT/CA/2003/000922.

PCT; International Preliminary Examination Report dated Sep. 20, 2004 in PCT Application No. PCT/CA/2003/000922.

* cited by examiner

SWITCH

BACKGROUND

Switches are used in a variety of fields and applications. For example, switches are often used to control light functions such as toggling lights on and off and controlling the light's intensity (i.e., dimming). A common type of switch for lighting control is known as a "rocker switch," where as one half of a switch is pressed in, the other half extends out, and vice versa. However, in order to properly operate a rocker switch, a degree of specificity is required when applying force to the face of the switch. For example, if force is not applied to the correct portion of the rocker switch (i.e., one particular half of the switch), the switch will not pivot properly. Applying an accurate force to a switch may not be easily performed by those with diminished eyesight or manual dexterity, or by individuals wearing prostheses or attempting to manipulate the switch with anything other than one's fingers (e.g., with an elbow when one's hands are full).

Some switches include capacitive touch technology that controls a function associated with the switch when the human skin of a user comes in contact with the switch face, instead of mechanical depression of the switch. While capacitive touch switches may not require the same level of dexterity to operate as some mechanical switches (such as the rocker switch described above), capacitive touch switches may likewise not be able to operate when touched by a prosthesis. Likewise, some capacitive touch switches may not be able to recognize the skin of an elbow, or operate properly when the user is wearing gloves.

Embodiments in this disclosure address these and other issues.

BRIEF SUMMARY

A switch according to various embodiments of the disclosure comprises a mechanical actuator configured to control a function associated with the switch and a face coupled to the actuator. The face is configured to depress in response to a force applied to at least a portion of the face, whereby depression of the face engages the actuator to control the function associated with the switch. The face includes a plurality of segments, each segment for controlling a respective additional function associated with the switch. A respective touch sensor is coupled to each respective segment of the plurality of segments, wherein each touch sensor is configured to control the function associated with its respective segment in response to detecting human skin in contact with the segment.

A method for manufacturing a switch according to various aspects of the disclosure includes providing a mechanical actuator configured to control a function associated with the switch and coupling a face to the actuator. The face is configured to depress in response to a force applied to at least a portion of the face, whereby depression of the face engages the actuator to control the function associated with the switch, wherein the face includes a plurality of segments, each segment for controlling a respective additional function associated with the switch. The method further includes coupling a respective touch sensor to each respective segment of the plurality of segments, wherein each touch sensor is configured to control the function associated with its respective segment in response to detecting human skin in contact with the segment.

It is to be understood that both the foregoing general description and the following detailed description are exemplary and explanatory only and are not restrictive of the disclosure, as claimed.

BRIEF DESCRIPTION OF THE DRAWINGS

A more complete understanding of the embodiments of the present disclosure may be derived by referring to the detailed description and claims when considered in connection with the following illustrative figures.

DETAILED DESCRIPTION

The detailed description of exemplary embodiments herein makes reference to the accompanying drawings and pictures, which show the exemplary embodiment by way of illustration and its best mode. While these exemplary embodiments are described in sufficient detail to enable those skilled in the art to practice the disclosure, it should be understood that other embodiments may be realized and that logical and mechanical changes may be made without departing from the spirit and scope of the disclosure. Thus, the detailed description herein is presented for purposes of illustration only and not of limitation. For example, the steps recited in any of the method or process descriptions may be executed in any order and are not limited to the order presented. Moreover, any of the functions or steps may be outsourced to or performed by one or more third parties. Furthermore, any reference to singular includes plural embodiments, and any reference to more than one component may include a singular embodiment.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. After reading the description, it will be apparent to one skilled in the relevant art(s) how to implement the disclosure in alternative embodiments.

In various embodiments, the methods described herein are implemented using the various particular machines described herein. The methods described herein may be implemented using the below particular machines, and those hereinafter developed, in any suitable combination, as would be appreciated immediately by one skilled in the art. Further, as is unambiguous from this disclosure, the methods described herein may result in various transformations of certain articles.

Exemplary Switch

Figure 1:
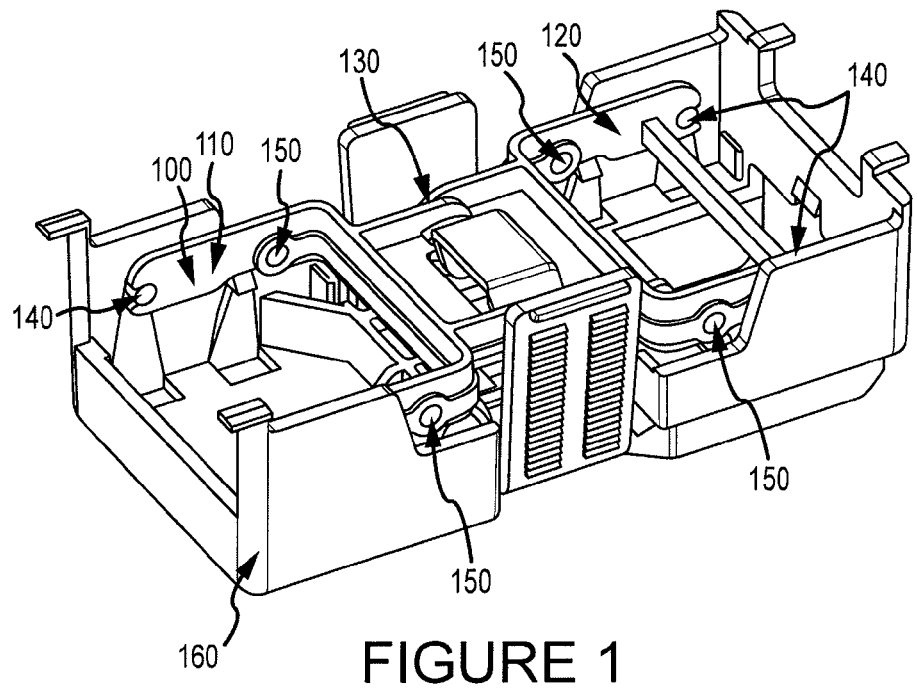
FIGS. 1 and 2 illustrate portions of an exemplary switch according to various embodiments of the disclosure.

FIG. 1 illustrates a portion of an exemplary switch according to various embodiments of the disclosure. In this embodiment, a mechanical actuator 100 includes two arms (110, 120) which are coupled in together by hinge point 130. Arms 110 and 120 are coupled to the switch body 160 at four fixed hinge points 140.

Figure 2:
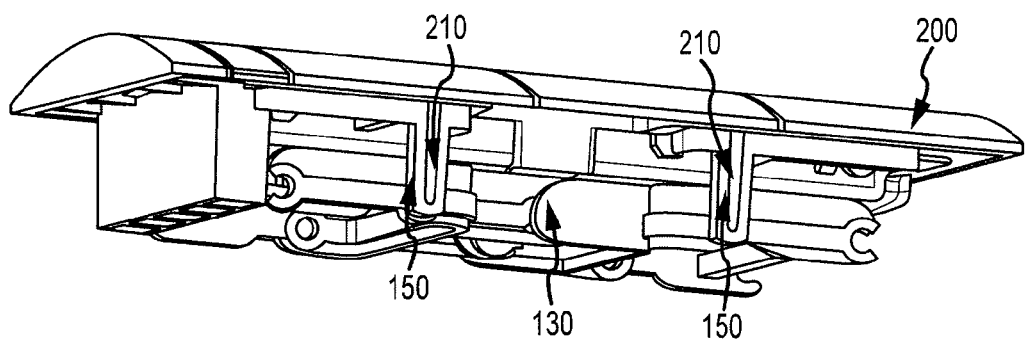

As further shown in FIG. 2, a face 200 is coupled to the actuator 100. In this embodiment, the face 200 attaches to the actuator 100 via four standoffs 210 attached to four raised hinge points 150. The face 200 and actuator 100 may be permanently coupled together, or removably coupled together. Among other things, configuring the face 200 to be removably coupled to the actuator 100 allows faces with custom labeling/engraving to be installed and for switches with faulty faces to be replaced without replacing the entire switch. Whereas conventional switches may provide a generic name or description of the switch, users of switches according to embodiments of this disclosure can customize the faces of their switches to better reflect the function(s) of each respective switch. In one embodiment, combining a removable face with an inexpensive film to form the segments helps provide an inexpensive way to reconfigure and/or re-label a switch without requiring the other components of the switch to be exchanged.

The face 200 is configured to depress in response to a force applied to at least a portion of the face 200. Depression of the face 200 in turn engages the actuator 100 to control a function associated with the switch. Switches according to embodiments of this disclosure may operate in conjunction with any number and type of different devices, and the actuator 100 may be configured to control any desired function(s) of such devices, such as to activate, deactivate, and control the intensity (via dimming) of a lighting device or multiple lighting devices (e.g., in a zone). The actuator 100 may include, or couple to, a mechanical button or other structure to control a function associated with the switch. In one embodiment, as shown in FIG. 2, the switch face 200 is configured larger than the decora opening in which the switch is inserted. Among other things, this allows for larger (and thus easier to press) segments of the face 200, as well as for larger (and thus easier to read) labels on the switch.

In the embodiment depicted in FIGS. 1 and 2, as a user applies force to depress the switch face 200, the face 200 engages the actuator 100 via the stand-offs 210 and hinge points 150. The arms 110, 120 pivot around the fixed hinges 140 (which may amplify movement of the hinge points 130) and forces the arms 110, 120 downwards at center hinge point 130. Engagement of the actuator may, for example, activate a mechanical button (not shown) to control a feature associated with the switch. The amplification of the movement of the hinge points 130 allows the face 200 to be depressed a shorter distance and still engage the actuator 100.

In this embodiment, the hinge coupling 130 between arms 110 and 120 helps ensure that regardless of where force is applied to the face 200, the face 200 (and actuator 100 to which it is attached) depresses uniformly. In other words, each of hinge points 150 (coupled to standoffs 210) move up and down in unison. This allows any portion of the face 200 to be depressed and the face 200 will depress uniformly, as opposed to pivoting like a rocker switch. Among other things, this allows switches according to embodiments of this disclosure to be operated more easily than conventional switches requiring a more accurate application of force to operate. Additionally, the uniform movement of the face 200 conveys a very precise feeling to the user, without the feel of material bending or pivoting due to the force applied to the switch.

Figure 3:
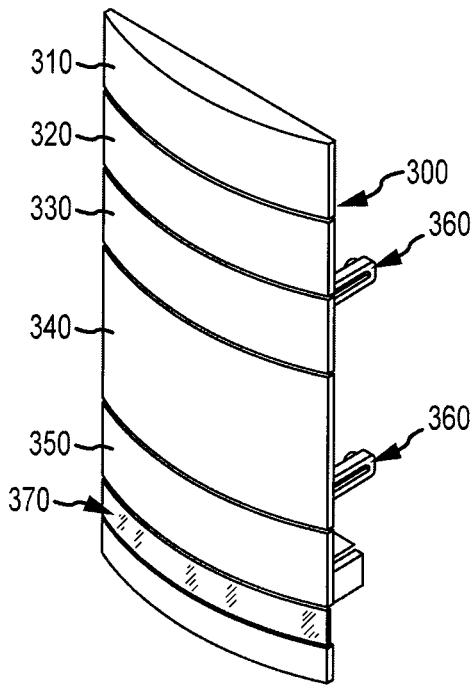
FIG. 3 depicts an exemplary embodiment of a switch face in accordance with various embodiments.

FIG. 3 depicts an exemplary embodiment of a face 300 which includes a plurality of segments 310-350 for controlling a respective function associated with the switch (in addition to the function controlled by the mechanical actuator 100). There is a respective touch sensor coupled to each respective segment 310-350. Each touch sensor is configured to control the function associated with its respective segment 310-350 in response to detecting human skin in contact with the segment 310-350. Any suitable type of touch sensor may be used in conjunction with embodiments of this disclosure, including resistive touch sensors, capacitive touch sensors, infrared touch sensors, and/or acoustic pulse recognition sensors. In an exemplary embodiment depicted in FIG. 3, the touch sensors are capacitive touch sensors.

Figure 4:
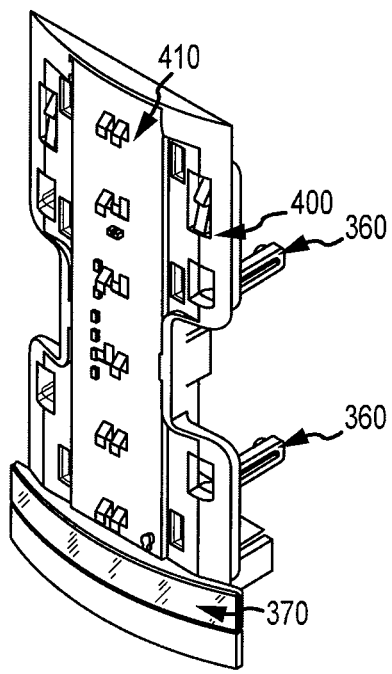
FIG. 4 illustrates an exemplary backer coupled to the switch face in FIG. 3.
Figure 5:
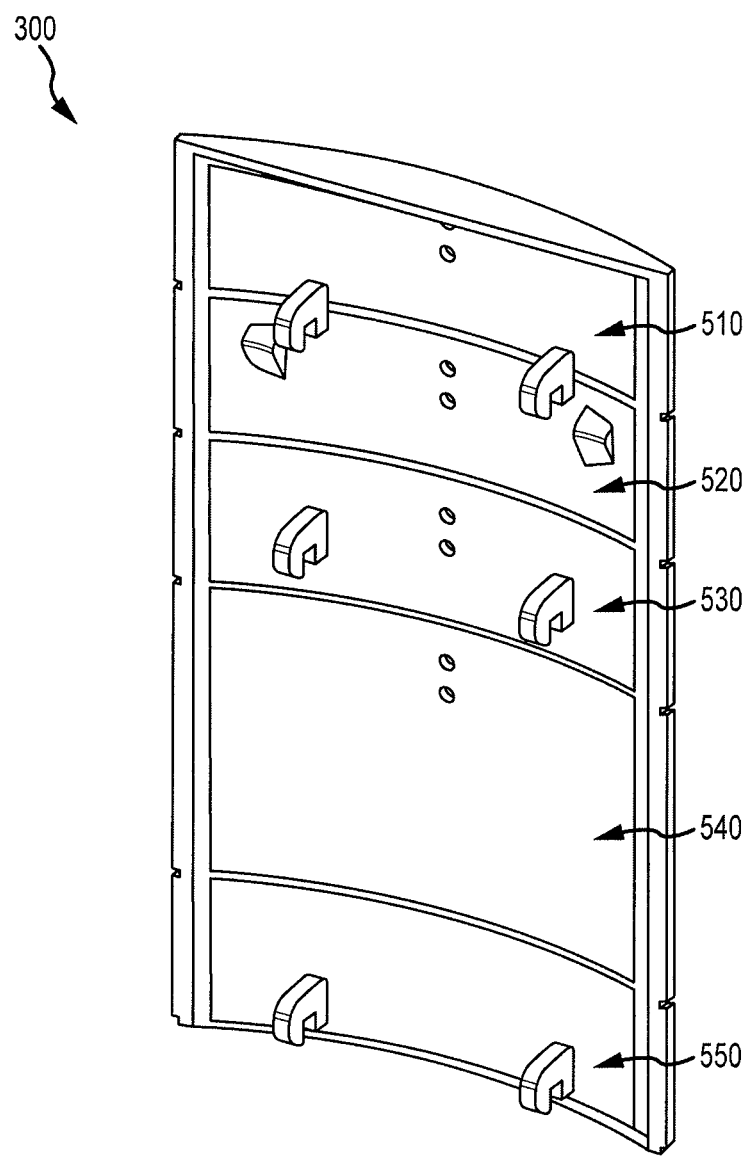
FIG. 5 depicts the rear of the switch face in FIG. 3.

FIGS. 4 and 5 depict an exemplary embodiment whereby a front portion of the face 300 is configured to removably attach to a backer 400, which in turn removably attaches to the mechanical actuator 100 via four standoffs 360. In alternate embodiments, the front portion of the face 300 and backer 400, and/or the face 300 and actuator 100, may be permanently affixed together. In one embodiment, the mechanical actuator 100 is configured to generate a tactile indicator in response to the face 200 or 300 being depressed. Unlike conventional switches with capacitive touch sensors, this helps confirm to a user of the switch that one of the segments 310-350 was actually pressed.

In an embodiment shown in FIGS. 4 and 5, the plurality of capacitive touch sensors are formed by an insulating film, such as a polyimide film with a selective surface coating (such as carbon) on rear portions of the face 300 (510, 520, 530, 540, 550) which make contact with portions of a printed circuit board 410 on the backer. Each coated portion on the rear of the face 300 (510, 520, 530, 540, 550) corresponds to one of the segments (310, 320, 330, 340, 350, respectively).

The segments 310-350 may control any desired function associated with the switch. In one embodiment, for example, segments of the switch may be used to select lighting zones, such that only one of the segments can control zone selection at any one time.

In conventional switches utilizing capacitive touch sensors, the sensors typically run continuously in order to track a baseline capacitance and to routinely measure the capacitance of the switch face in order to recognize when the switch face is in contact with human skin. The continuous operation of such devices may draw an excessive amount of power, and thus can be unsuitable for energy-efficient applications or for powering by energy-harvesting (e.g., solar) systems. Embodiments of this disclosure can help obviate issues of excessive power drain by capacitive touch sensors in switches. In one embodiment, the capacitive touch sensors are only activated (i.e., supplied with power) in response to the face engaging the mechanical actuator. In this embodiment, a baseline capacitance reading is not required as engagement of the mechanical actuator already indicates that the face of the switch is depressed. The capacitive field detectors need only determine which segment is being touched (i.e., the segment reading the strongest capacitive field). Otherwise, the capacitive touch sensors remain inactive (and thus not drawing power), thereby conserving energy.

The switch may exhibit different functionality when the face 200 is depressed, depending on whether or not a capacitive touch sensor also registers contact with the face 200. In one embodiment, if any of the capacitive touch sensors register contact with human skin, control of the function associated with the mechanical actuator 100 is preempted. In this embodiment, the switch can perform a default function associated with the mechanical actuator 100, such as toggling lights on and off, when a user touches the switch such that the capacitive touch sensors cannot determine the exact segment of the face 200 or 300 that was touched (e.g., because the switch was pressed by an elbow, prosthesis, gloved hand, etc.). If, however, a sensor reads contact with a particular segment, then the function associated with that segment is controlled accordingly. In this way, while conventional capacitive touch switches would not function at all, switches according to this disclosure can still perform the function associated with the mechanical actuator 100 by default.

Figure 6:
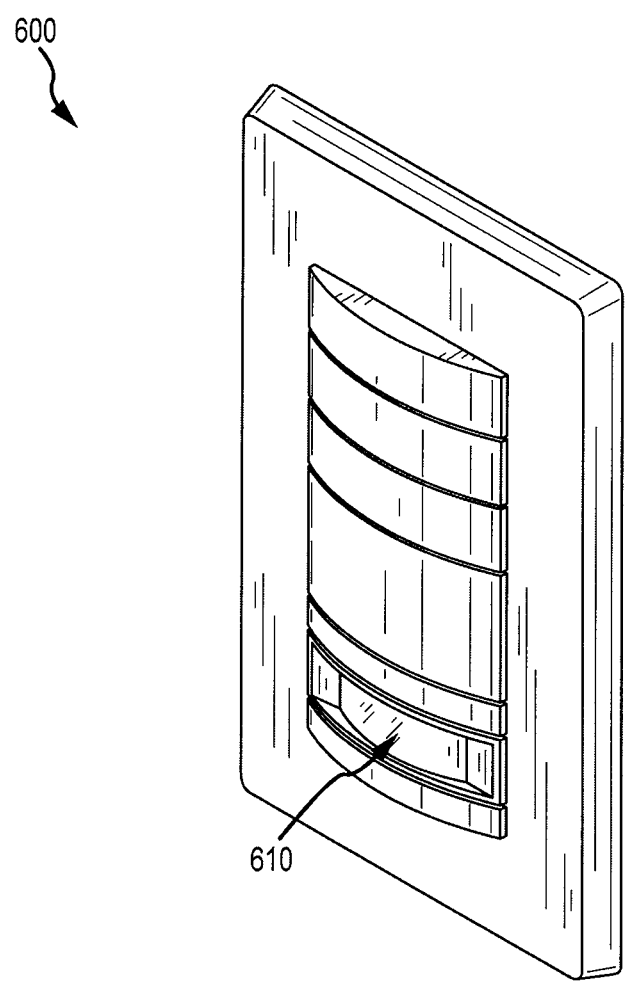
FIG. 6 illustrates another exemplary switch in accordance with various embodiments.

Switches according to various embodiments of this disclosure may include, or operate in conjunction with, any suitable device(s). In one embodiment, referring now to FIG. 6, switch 600 includes a sensor 610. Sensor 610 may include any suitable sensor(s), such as a motion sensor, a humidity sensor, an air quality sensor (e.g., for detecting carbon monoxide and/or carbon dioxide), a temperature sensor, and/or a light sensor. A sensor or other device (such as the display 370 described below) coupled to the switch may remain static in relation to the movement of the switch face, or may move in unison with the switch face. Among other things, allowing the sensor or other device to move in unison with the switch face helps reinforce a feeling of preciseness and rigidity as the switch operates.

In another embodiment, referring again to FIG. 3, switch 300 includes a display 370 for generating a visual indicator. Any type of visual indicator (such as words or symbols) can be used to convey any suitable information, including for example: a status of a building in which the switch is installed, a status for the switch, an emergency condition, a status of a device in communication with the switch, and/or a mode of operation for a control system in communication with the switch. The switch may also utilize light-emitting diodes or other devices to provide visual indicators. Exemplary embodiments may include any other suitable device, such as a microphone (e.g., for receiving audible input from a user or monitoring sound in a room), and/or a speaker (e.g., for providing audible indicators and information).

Among other things, the audible and/or visual indicators generated by a switch according to embodiments can help alert users to situations affecting use of the switch, particularly where the switch is connected to a sophisticated building control system. For example, there may be situations where pressing of a light switch should not cause any action, such as when a building control system communicates a fire alarm condition. Shades may rise in response and lighting may rise to full brightness in order to provide maximum illumination of an exit path out of the building. In such a case, it would be undesirable for a user to turn off the lights during the fire alarm. In other situations, the system may provide low light levels for a night guard when otherwise the lights are expected to be off.

While traditionally a light switch and the state of the lights are in synch, with a sophisticated lighting system this may not be the case and a user's perception could be that the lighting system is malfunctioning. In such cases, visual indicators (e.g., provided through display 370) and/or visual indicators can provide information to the user. In the embodiment depicted in FIG. 3, the display 370 can be configured to display symbols indicating an emergency condition or other information (e.g., in the case of a fire alarm, a flame symbol may be indicated). If a user attempts to turn off the lights, the symbol may additionally blink and/or an audio transducer may play an audible indicator comprising a "fault" sound, thereby clarifying to the user that the switch is still functioning, but that there are reasons for it not turning off the lights. The display can also show symbols indicating other information. For example, a "moon" symbol can be displayed to indicate a night mode, while a "leaf" can be displayed to indicate an energy saving mode.

The above-described embodiments may be implemented in any manner, such as through hardware, software, or a combination of the two. Functionality implemented through software may be performed by any suitable computer-based system. Such a software program may be stored on any computer-readable medium, such as floppy disks, hard disks, CD-ROMs, DVDs, any type of optical or magneti-optical disks, volatile or non-volatile memory, and/or any other type of media suitable for storing electronic instructions and capable of interfacing with a computing device. Methods according to embodiments of present invention may operate in conjunction with any type of computer system, such as a personal computer (PC), server, cellular phone, personal digital assistant (PDA), portable computer (such as a laptop), embedded computing system, and/or any other type of computing device. The computer system may include any number of computing devices connected in any manner, such as through a distributed network. The computer system may communicate and/or interface with any number of users and/or other computing devices to send and receive any suitable information in any manner, such as via a local area network (LAN), cellular communication, radio, satellite transmission, a modem, the Internet, and/or the like.

The particular implementations shown and described above are illustrative of the invention and its best mode and are not intended to otherwise limit the scope of the present invention in any way. Indeed, for the sake of brevity, conventional data storage, data transmission, and other functional aspects of the systems may not be described in detail. Furthermore, the connecting lines shown in the various figures are intended to represent exemplary functional relationships and/or physical couplings between the various elements. Many alternative or additional functional relationships or physical connections may be present in a practical system.

The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" should be construed to exclude only those types of transitory computer-readable media which were found in In Re Nuijten to fall outside the scope of patentable subject matter under 35 U.S.C. §101.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to 'at least one of A, B, and C' or 'at least one of A, B, or C' is used in the claims or specification, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Although the disclosure includes a method, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switch comprising:
    a mechanical actuator configured to control a function associated with the switch, wherein the mechanical actuator comprises:
    a first arm coupled to the face;
    a second arm coupled to the face; and
    a hinge coupling connecting the first arm and the second arm, whereby a force exerted along either the first arm or the second arm causes both the first arm and the second arm to depress;
    a face coupled to the actuator, the face configured to depress in response to a force applied to at least a portion of the face, whereby depression of the face engages the actuator to control the function associated with the switch, wherein the face includes a plurality of segments, each segment to control a respective additional function associated with the switch; and
    a respective touch sensor coupled to each respective segment of the plurality of segments, wherein each touch sensor is configured to control the function associated with its respective segment in response to detecting human skin in contact with the segment.

2. The switch of claim 1, wherein the face is configured to depress uniformly regardless of the portion of the face to which the force is applied.

3. The switch of claim 1, wherein the plurality of touch sensors are activated in response to the face engaging the mechanical actuator.

4. The switch of claim 1, wherein the mechanical actuator is configured to generate a tactile indicator in response to the face being depressed.

5. The switch of claim 1, wherein detection of human skin in contact with a segment preempts control of the function by the mechanical actuator.

6. The switch of claim 1, wherein the plurality of segments includes a first segment and a second segment, wherein only one of the first segment or the second segment controls its respective function at any one time.

7. The switch of claim 1, further comprising a sensor configured to control a function associated with the switch.

8. The switch of claim 1, wherein the switch is configured to generate an indicator comprising one or more of an audible indicator and a visual indicator, the indicator to convey one or more of:
    a status of a building in which the switch is installed;
    a status for the switch;
    an emergency condition;
    a status of a device in communication with the switch; and
    a mode of operation for a control system in communication with the switch.

9. The switch of claim 8, further comprising a display, wherein the visual indicator is generated via the display.

10. The switch of claim 1, wherein the face is removably coupled to the actuator.

11. The switch of claim 10, wherein the plurality of touch sensors include capacitive touch sensors, wherein each capacitive touch sensor comprises an insulating film and a selective surface coating formed on a rear portion of the face.

12. The switch of claim 1, wherein the plurality of touch sensors include capacitive touch sensors, each capacitive touch sensor comprises an insulating film and a selective surface coating formed on a rear portion of the face.

13. The switch of claim 1, further comprising a cover plate, wherein the face extends over at least a portion of the cover plate.

14. A method of manufacturing a switch, comprising:
    providing a mechanical actuator configured to control a function associated with the switch, wherein the mechanical actuator comprises:
    a first arm coupled to the face;
    a second arm coupled to the face; and
    a hinge coupling connecting the first arm and the second arm, whereby a force exerted along either the first arm or the second arm causes both the first arm and the second arm to depress;
    coupling a face to the actuator, the face configured to depress in response to a force applied to at least a portion of the face, whereby depression of the face engages the actuator to control the function associated with the switch, wherein the face includes a plurality of segments, each segment to control a respective additional function associated with the switch; and
    coupling a respective touch sensor to each respective segment of the plurality of segments, wherein each touch sensor is configured to control the function associated with its respective segment in response to detecting human skin in contact with the segment.

15. The method of claim 14, further comprising providing a sensor configured to control a function associated with the switch.

16. The method of claim 14, further comprising configuring the switch to generate an indicator comprising one or more of an audible indicator and a visual indicator, the indicator for conveying one or more of:
    a status of a building in which the switch is installed;
    a status for the switch;
    an emergency condition;
    a status of a device in communication with the switch; and
    a mode of operation for a control system in communication with the switch.

17. The method of claim 16, further comprising providing a display, wherein the visual indicator is generated via the display.

18. The method of claim 14, wherein coupling a face to the actuator comprises removably coupling the face to the actuator, the face configured to depress in response to a force applied to at least a portion of the face, whereby depression of the face engages the actuator to control the function associated with the switch, wherein the face includes a plurality of segments, each segment for controlling a respective additional function associated with the switch.

19. The method of claim 18, wherein coupling a respective touch sensor comprises coupling a respective capacitive touch sensor to each respective segment of the plurality of segments, wherein each capacitive touch sensor comprises an insulating film and a selective surface coating formed on a rear portion of the face, and wherein each capacitive touch sensor is configured to control the function associated with its respective segment in response to detecting human skin in contact with the segment.

* * * * *